IN-LINE THERMOELECTRIC ASSEMBLY

Filed Dec. 17, 1962 2 Sheets-Sheet 1

INVENTORS
JOSEF INTRATER
LAWRENCE R. HILL
BY James and Franklin
ATTORNEYS

INVENTORS
JOSEF INTRATER
LAWRENCE R. HILL
BY
Kames and Franklin
ATTORNEYS 3,468,722
IN-LINE THERMOELECTRIC ASSEMBLY
Josef Intrater, New York, N.Y., and Lawrence R. Hill, Short Hills, N.J.; said Intrater assignor to Electronics & Alloys, Inc., Ridgefield, N.J., and said Hill assignor to General Instrument Corporation, Newark, N.J., both corporations of New Jersey
Filed Dec. 17, 1962, Ser. No. 249,967
Int. Cl. H01v 1/30, 1/02
U.S. Cl. 136—205 21 Claims The present invention relates to a novel assembly of thermoelectric units.

A thermoelectric assembly generally comprises a large number of thermoelectric units with their hot and cold sides appropriately connected in electrical and thermal circuits. In general the electrical connection is of a series type, so that failure of a single unit causes failure of the entire assembly. In case of failure the failed unit must first be identified and then replaced. With conventional arrangements, in which the thermoelectric units are rigidly connected in pi-configuration, access to individual units for testing is not easy, and the removal and replacement of a unit identified as having failed represents a major task.

The rigid connection of the thermoelectric units to one another, characteristic of prior art devices, represents a significant limitation in design, since once a given assembly has been made its configuration cannot be changed.

The structures of the prior art have, for electrical reasons, required the use of electrical insulators in the thermal path—the hot and cold sides of the individual units are connected to heat sources or heat dissipating assemblies which are electrically conductive, and which would short-circuit the electrical connections in the absence of appropriate electrical insulation. The existence of these insulating elements in the thermal paths impairs the efficiency and rapidity of the temperature response of the units.

In prior art rigidified assemblies any stresses or strains to which the assembly is subjected arising from external forces are transmitted to a substantial extent to the thermoelectric units themselves. Similarly, stresses and strains within the assemblies arising from differences in the temperature coefficients of expansion of the thermoelectric material and the other elements of the assemblies are also transmitted to the thermoelectric bodies themselves. These bodies are essentially weak, and such stresses and strains contribute in large degree to the breakdown of the units.

It is the prime object of the present invention to produce a thermoelectric assembly which avoids all of the above disadvantages. The individual units are readily accessible, and may be easily removed from and replaced in the assembly without having to disturb other units in the assembly. Fabrication of the assembly, including the mechanical, thermal and electrical connection of the various parts which make up the assembly, is very easily accomplished, and with a high degree of reliability of operation. The arrangement is such that a completed assembly can have its shape modified, thus permitting a given assembly, at the point of use, to be caused to conform to a wide variety of desired configurations or to fit into a wide variety of different spaces. The spatial flexibility of the assembly also permits the adaptation of the assembly to a wide variety of different thermal conditions and to use with a wide variety of different heat sources and heat dissipating devices. Moreover no electrical insulation is required in the thermal circuits of the assembly—the hot and cold sides of the units may be placed in direct thermal communication with heat transmissive elements leading respectively to the heat source and heat dissipating means utilized in a given instance, and without adversely affecting the electrical circuits involved. In addition, the assembly is so constructed that externally applied forces are either not transmitted at all to the individual thermoelectric units or are transmitted thereto only to a truly minimal extent, and the deleterious effects normally arising from temperature changes are to a large extent eliminated.

In accordance with the present invention the individual thermoelectric units are arranged in a row, with the hot side of each unit facing or opposing the hot side of an adjacent unit and with the cold side of each unit facing or opposing the cold side of an adjacent unit. Heat conducting elements are secured to the hot and cold sides of the units respectively in good, and preferably direct, heat conductive relation therewith. The elements connected to the hot sides and the elements connected to the cold sides define different sets of elements which extend respectively to a heat source and to a heat sink or means of heat dissipation. Electrical connections are provided between each pair of opposed sides, the electrical connections between one or more pairs of opposed sides preferably being mechanically flexible. These flexible electrical connections may comprise conductive wires or straps secured to and extending between the thermoelectric unit sides in question. Hence once the thermoelectric units have been assembled together they define an in-line assembly, and when flexible electrical connections are employed, the line configuration can be modified or altered at will. Thus the individual units can be arranged in a straight line, in a circle, or even in a sinuous or irregular line. It is preferred that the heat conducting elements connected to one type of side (hot or cold) extend out from the assembly in one direction and that the other set of heat conducting elements extend out in another direction therefrom, thus facilitating the application of heat to those elements connected to the hot sides of the thermoelectric units and the removal of heat from those elements connected to the cold sides of the thermoelectric units.

In one embodiment the heat conducting elements which are connected to a given set of sides (hot or cold) also serve to rigidly connect a pair of adjacent thermoelectric units together, thereby to define a relatively permanently connected pair of thermoelectric units. The electrical connections between the units of each such pair need not be flexible, and may be defined either wholly or in part by the heat conducting elements themselves and by direct engagement between the appropriate terminal areas of the thermoelectric units of that pair. The flexible electrical connections are provided between those sides of the units of two adjacent pairs of connected units which are exposed at the outer ends of said pairs and which are opposed to one another, each of said sides preferably having an individual heat conducting element directly connected thereto.

Alternatively, the initial assembly can comprise an in-line arrangement of thermoelectric units with flexible electrical connections established between opposed similar sides of the units in that row, heat conductive elements being interposed between opposed similar sides of the thermoelectric units, the units and heat conductive elements being pressed against one another so as to mantain the integrity of the overall assembly. The flexibility of electrical connection between opposed thermoelectric unit sides permits the attainment of assemblies of different configuration. The heat conducting elements may be provided with sockets into which the sides of the thermoelectric units are adapted to be received, thereby further rigidifying the thus-produced assemblies.

To the accomplishment of the above, and to such other objects as may hereinafter appear, the present invention relates to an in-line thermoelectric assembly as defined in the appended claims and as described in this specification, taken together with the accompanying drawings, in which:

FIG. 1 is a top plan view of one embodiment of the thermoelectric assembly of the present invention;

FIGS. 2 and 3 are fragmentary cross sectional views taken along the lines 2—2 and 3—3 respectively;

Figure 1:
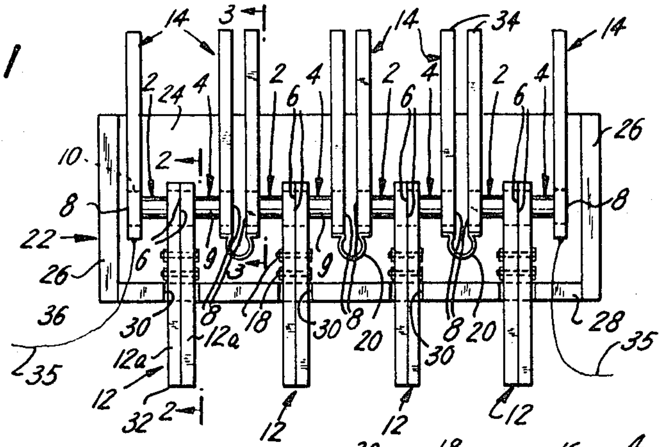

The thermoelectric assembly of the present invention comprises a plurality of thermoelectric units 2 and 4 of opposite types, each unit having a hot side 6 and a cold side 8. The thermoelectric units 2 and 4 are arranged in a row with the units 2 and 4 alternating, with the hot sides 6 of adjacent units facing or opposing one another, and the cold sides 8 of adjacent units facing or opposing one another. (The term "row" as here used does not necessarily imply a straight line arrangement, but instead signifies a linear sequential arrangement, irrespective of whether or not that line is straight, curved, circular, sinuous, or even irregular.)

While the specific nature and construction of the thermoelectric units 2 and 4, per se, may be widely varied, and forms no part of the present invention, the arrangement of the present invention is particularly well adapted for use with thermoelectric units of the type shown and claimed in our copending application Ser. No. 223,871, filed Sept. 13, 1962, now Patent No. 3,197,845 entitled "Method of Forming Thermoelectric Units with Attached Contact Terminals, and Products Produced Thereby," and assigned to the assignees of the present invention. The thermoelectric units of said copending application are conveniently made to comprise a body portion 9 with terminal elements 10 at each side of the unit. Those terminal elements 10 are both electrically and thermally connected to the hot and cold sides 6 and 8 respectively of the units, said electrical and thermal connections being highly efficient and reliable, and exceptionally capable of withstanding wide and rapid temperature changes without deterioration or damage to the thermoelectric unit.

First and second sets of heat conducting elements, generally designated 12 and 14 respectively, are physically connected in good heat conductive relation to one and the other of the sets of hot and cold sides 6 and 8, and preferably also in good electrically conductive relation to the terminal portions 10 at those sides. As here specifically disclosed, the heat conducting elements 12 are connected to the hot sides 6 of the units 2 and 4, while the heat conducting elements 14 are connected to the cold sides 8 thereof. This connection may be accomplished in any suitable mechanical manner. For example, as disclosed in FIG. 1 each of the elements 12 and 14 is provided adjacent one end with an aperture 16 into which the terminal portion 10 at the appropriate side of the corresponding thermoelectric unit 2 or 4 is snugly received, as by a press fit. For greater security, the heat conductive elements 12 and 14, which may be formed of steel or aluminum, may first be heated so as to expand the opening 16 and then permitted to cool and shrink onto the terminal portion 10 of a thermoelectric unit, the latter previously having been inserted into the opening 16.

Figure 2:
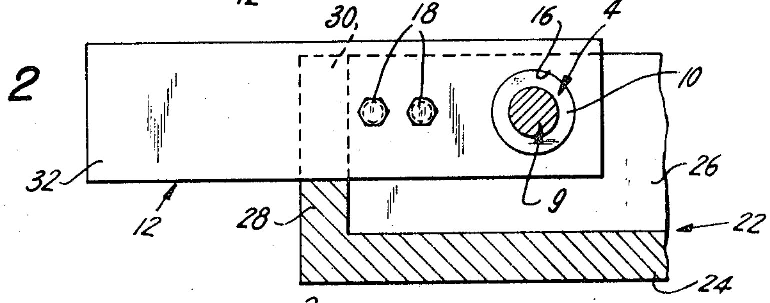
Figures 3, 4:
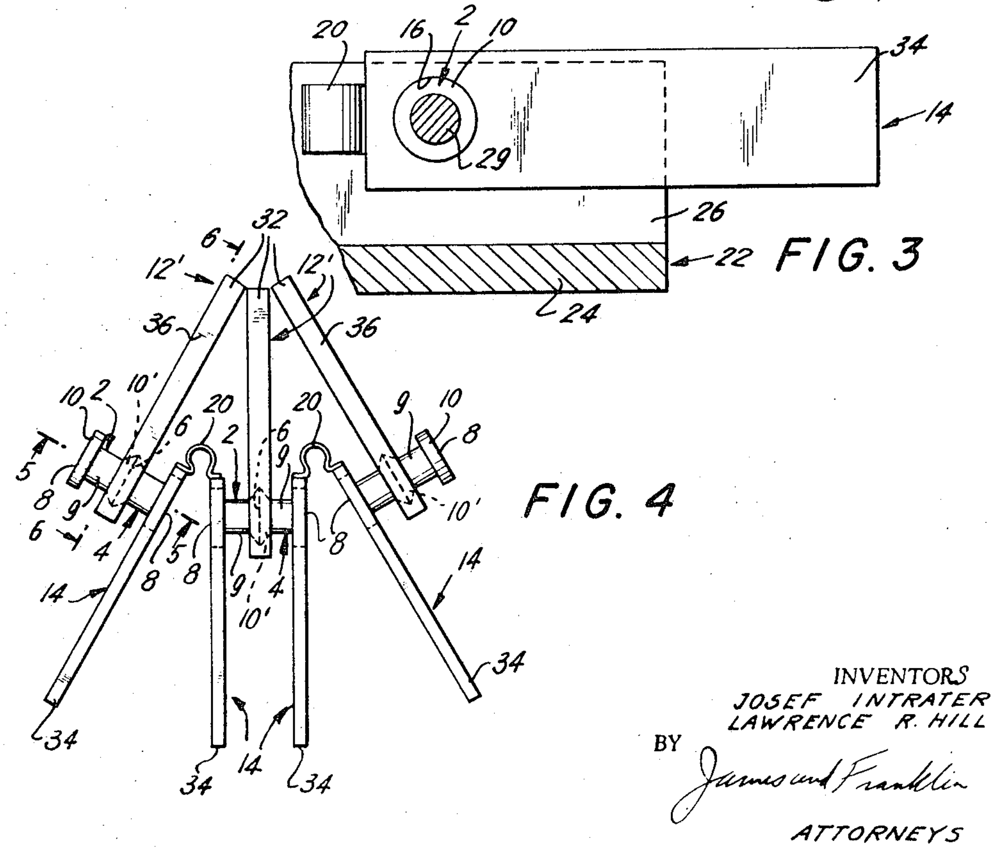
FIG. 4 is a top plan view of a portion of the assembly similar to FIG. 1 but arranged in a different configuration, the means for securing adjacent pairs of thermoelectric units to one another being different from the embodiment of FIG. 1.

As specifically disclosed in FIGS. 1–3, each thermoelectric unit 2 and 4 has a heat conducting element 14 secured to its cold side 8 and a heat conducting element part 12*a* secured to its hot side 6, the elements 14 and the element parts 12*a* extending respectively in opposite directions from the thermoelectric unit 2 or 4. The element parts 12*a* of adjacent units 2, 4 are secured to one another, as by bolts 18 passing therethrough, thereby to substantially rigidly connect different pairs of different thermoelectric units 2 and 4 into subassemblies. When the heat conducting element parts 12*a* are formed of an electrically conductive material, and when they are thus directly engaged with and pressed against one another, they will, in whole or in part, constitute an electrical connection between the hot sides 6 of each pair of physically connected thermoelectric units 2 and 4. Also, if desired, the individual units 2 and 4 could be so positioned in their respective heat conducting element parts 12*a* that when those parts 12*a* are clamped together by the bolts 18, the terminal portions 10 of the thermoelectric units 2 and 4 are physically pressed against one another, thereby to establish direct electrical connection therebetween.

The heat conducting elements 14 which are connected to the cold ends 8 of adjacent thermoelectric units 2 and 4 may be rigidly connected to one another, thereby to function like the heat conducting element parts 12*a* to rigidify the entire assembly and to define, or contribute to the production of, an electrical connection between the colds ends 8 of adjacent thermoelectric units 2 and 4. However, it is preferred that the heat conducting elements 14 be not rigidly secured to one another by means of a flexible conductive wire or strip 20 secured to adjacent elements 14 close to the openings 16 formed therein. This securement may be made in any desired manner, such as by welding, brazing, soldering or the use of screws or other fastening devices.

By reason of the flexible nature of the parts 20 which connect adjacent pairs of heat conducting elements 14, the several rigidly connected pairs of thermoelectric units 2, 4 can be arranged in a wide variety of linear configurations, and can be retained in those configurations by any suitable structural means adapted to engage either the thermoelectric units 2 and 4 or one or the other or both of the sets 12 and 14 of heat conducting elements. As disclosed in FIG. 1 the arrangement is held in straight line relation by a support generally designated 22 and having a bottom wall 24, side walls 26 and front wall 28, the front wall being provided with a plurality of upwardly opening slots 30 so sized and spaced as to be adapted to receive the heat conducting elements 12 therein. The ends 32 of the heat conducting elements 12 extend out beyond the wall 28, while the ends 34 of the heat conducting elements 12 extend out beyond the edge of the bottom wall 24. Appropriate electrical connections, generally designated 35, are made to the exposed ends of the outermost thermoelectric units.

An external source of heat, such as a bank of burners, may be operatively connected to the ends 32 of the elements 12, thereby to provide heat for the hot sides 6 of the thermoelectric units. The ends 34 of the elements 14 are exposed to dissipate heat, and thereby cool the cold sides 8 of the thermoelectric units. Any suitable means may be utilized to facilitate the dissipation of heat therefrom. Thus it will be seen that the thermal circuit for the assembly disclosed is highly efficient in nature, a direct, efficient, highly heat-conductive and uninterrupted thermal path being provided from the heat source through the elements 12 to the hot sides 6 of the thermoelectric units and a similar thermal path being provided through the elements 14 to the cold sides 8 of those units, and all without interfering with the maintaining of an appropriate electrical series connection from one element to another.

If it is desired to form the assembly into a configuration other than a straight line, this may readily be done simply by bending the flexible electrical connections 20. Thus, as disclosed in FIG. 4, the elements 12 connected to the hot sides 8 may be oriented so that their ends 32 meet, or substantially so, thus producing a circular array or row of thermoelectric units, with the elements 14 radiating out from that circle. This particular configuration is extremely efficient, since a concentrated heat source may be utilized to apply heat to all of the elements 12 at their ends 32, while the heat dissipating elements 14 are spaced from one another, thereby more efficiently to perform their designed function. The parts can be maintained in the configuration shown in FIG. 4 in a variety of ways, as by clamping the ends 32 of the elements 12 together or by utilizing a support similar to the support 22 but appropriately curved into circular configuration, rather than being straight as shown in FIG. 1.

Figures 5, 6:
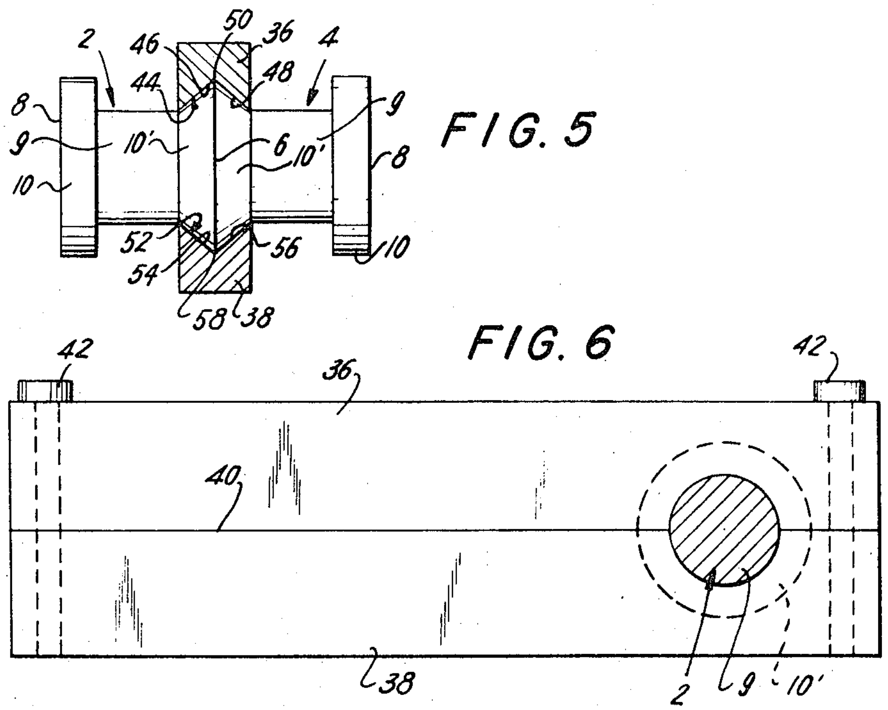
FIG. 5 is a cross sectional view taken along the line 5—5 of FIG. 4, but with the end heat conducting element removed.
FIG. 6 is a cross sectional view taken along the line 6—6 of FIG. 4.

In the embodiment of FIG. 4 the elements 12′ are differently constructed from the elements 12 in FIG. 1, and the terminal portions 10′ of the units 2 and 4 which are engaged thereby are correspondingly modified. Each element 12′ comprises an upper half 36 and a lower half 38 meeting along line 40 and adapted to be held firmly together by screws 42. The upper half 36 is provided, adjacent the end where it is to engage a thermoelectric unit, with a semicircular recess 44 having tapered walls 46 and 48 meeting at vertex 50. The lower half 38 is provided with a mating semicircular recess 52 provided with tapering walls 54 and 56 meeting at vertex 58. The cross section of the recesses 44 and 52 is essentially V-shaped. The terminal portions 10′ at the hot sides 6 of the thermoelectric units 2 and 4 have their outer surfaces inclined in a manner corresponding to the surfaces 46, 48, 54 and 56. Consequently, when the thus shaped terminal portions 10′ of a pair of thermoelectric units 2 and 4 are positioned inside the recesses 44 and 52 of upper and lower halves 36 and 38 of a given heat conducting element 12′, and those halves 36 and 38 are clamped against one another by the screws 42, the inclined surfaces interact to firmly clamp the units 2 and 4 to the elements 12′ and, when the parts are appropriately dimensioned, as shown in FIG. 5, to urge the opposed hot sides 6 of each pair of units 2 and 4 firmly into engagement with one another, thereby to serve in whole or in part to provide an electrical connection therebetween.

It will be appreciated that whether the conducting element 12 is formed as shown in FIG. 1 or FIG. 4, the same efficient thermal circuits are produced, unimpaired and uninterrupted by electrical insulation, and without detriment to the security or effectiveness of the electrical circuits. It also will be appreciated that the elements 12 could be connected to the cold side 8 and the elements 14 could be connected to the hot sides 6 if desired.

Figure 7:
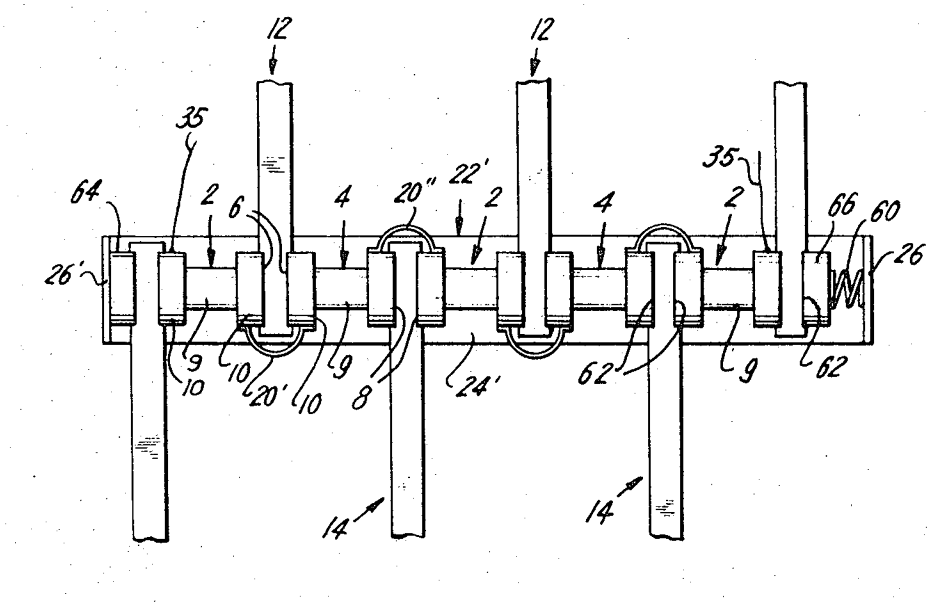
FIG. 7 is a top plan view of an alternative embodiment.

In the embodiments of FIGS. 1–6 the individual heat conducting elements 12 and 14 are comparatively permanently secured to the appropriate thermoelectric units 2 and 4, and at least some of the heat conducting elements 12 and 14 form a part of the electrical circuit between thermoelectric units. FIG. 7 illustrates an embodiment in which neither of these conditions exist, but in which the heat conducting elements 12 and 14 are separate from the thermoelectric units and form no necessary part of the electrical connections between those units.

In the embodiment of FIG. 7 a support 22′ is utilized having a bottom wall 24′ and end walls 26′. The individual thermoelectric units 2 and 4 are arranged in a row with the hot sides 6 of adjacent units 2 and 4 facing one another and with the cold sides 8 of adjacent units facing one another, as before. In this embodiment, each pair of facing hot sides 6 are physically and electrically connected to one another by a flexible electrical wire or strip 20′, which may be directly secured in any appropriate manner, as by brazing or welding, to the terminal portions 10 of each pair of adjacent units 2 and 4. Similarly a conductive wire or strip 20″ is utilized to mechanically or electrically connect the cold sides 8 of each pair of adjacent units 2 and 4. It is obvious, from the flexibility of the connecting elements 20′ and 20″, that the connected units 2 and 4 may be arranged in any desired linear configuration. The heat conducting elements 12 are designed to be interposed between the hot sides 6 of adjacent units 2 and 4, while the heat conducting elements 14 are adapted to be comparably interposed between the cold sides 8 of each adjacent pair of elements 2 and 4. Pressure means, such as the spring 60, is active on the row of thermoelectric units 2, 4 and interposed heat conducting elements 12, 14 so as to maintain those parts in position. The ends of the heat conducting elements 12 and 14 are preferably provided with sockets 62 into which the sides of the thermoelectric units 2 and 4 are adapted to be received. Since it is usually desired that the hot side elements 12 and the cold side elements 14 extend out from the row of thermoelectric units in different directions, and usually in opposite directions, the connecting strips 20′ and 20″ are appropriately located so as not to interfere with the elements 12 and 14. Thus, as shown in FIG. 7, the strips 20′ and 20″ are diametrically opposed to one another. An electrically insulating member 64 is interposed between the left hand side wall 26′ of the support 22′ and the cold side 8 of the last thermoelectric unit on the left, and a comparable insulating member 66 is interposed between the spring 26′ and the cold side 8 of the thermoelectric unit at the right hand end of the row, in order to insulate the thermoelectric elements from the support 22′. As in FIG. 1, electrical connections 35 are made to the outer ends of the first and last thermoelectric units in the row.

Because of the essentially non-rigid nature of the overall assembly, the individual thermoelectric units 2 and 4 will be seen to be substantially completely protected against damage from shock or external pulls or pushes. Differences in degree of thermal expansion as between the thermoelectric units and the supporting structure will have no adverse effect. The thermal circuits are exceptionally efficient. If a given assembly should fail, it is a very simple matter to gain access to each thermoelectric unit, or connected pair or group thereof, for testing and, when a particular unit has been identified as the source of trouble, to remove it from the overall assembly and replace it with a new unit. Replacement of individual units 2 or 4, or replacement of subassemblies comprising a pair of relatively permanently secured together units 2 and 4, can be carried out as desired. A given assembly of thermoelectric units and heat conducting elements can be used in a wide variety of environments merely by physically changing the row or line configuration of the assembly, thus permitting standardization of manufacture without requiring standardization of end use.

While but a limited number of embodiments of the present invention have been here specifically disclosed, it will be apparent that many variations may be made therein, all within the scope of the instant invention as defined in the following claims.

We claim:

1. A thermoelectric assembly comprising a plurality of thermoelectric units having hot and cold sides, said units being arranged in a row with the hot and cold sides of adjacent units opposing one another to define sets of opposed similar sides, first and second sets of heat conducting elements substantially rigidly operatively engaging and being in heat conductive relation with one and the other set respectively of said opposed similar sides, and electrical connections between the sides of each set of opposed sides, the electrical connections between a plurality of opposed sides being flexible, thereby permitting said units to be arranged in a row of desired configuration.

2. The assembly of claim 1, in which said second set of elements are electrically conductive and are electrically connected to the sides which they engage, thereby to comprise said electrical connections between said opposed sides of said other set of sides.

3. The assembly of claim 1, in which said elements of said second set comprise individual parts each secured to a different opposed side of said other set of sides, and means relatively fixedly securing opposed individual parts of said second set of elements to one another.

4. The assembly of claim 1, in which said elements of said second set comprise individual parts each secured to a different opposed side of said other set of sides, and means relatively fixedly securing opposed individual parts of said second set of elements to one another, each of said parts comprising electrically conductive sections which are electrically connected to one another and to said sides respectively, thereby to comprise said electrical connections between said other set of sides.

5. The assembly of claim 1, in which said other set of sides have first cam means, said elements of said second set comprising cooperating second cam means, and means for urging said first and second cam means into operative engagement with one another, said cam means being effective to clamp said opposed pair of sides in said elements of said second set respectively.

6. The assembly of claim 1, in which said other set of sides have first cam means, said elements of said second set comprising cooperating second cam means, and means for urging said first and second cam means into operative engagement with one another, said cam means being effective to clamp said opposed pair of sides in said elements of said second set respectively, and to urge said sides against one another.

7. A thermoelectric assembly comprising a plurality of thermoelectric units having hot and cold sides, said units being arranged in a row with the hot and cold sides of adjacent units opposing one another to define sets of opposed similar sides, first and second sets of heat conducting elements substantially rigidly operatively engaging and being in heat conductive relation with one and the other set respectively of said opposed similar sides, means securing at least said second set of elements to said other set of opposed sides, and electrical connections between each set of opposed sides, the electrical connections between at least some of the sides of said one set of opposed sides being flexible, thereby permitting said units to be arranged in a row of desired configuration.

8. The assembly of claim 7, in which said second set of elements are electrically conductive and are electrically connected to the sides which they engage, thereby to comprise said electrical connections between said opposed sides of said other set of sides.

9. The assembly of claim 7, in which said elements of said second set comprise individual parts each secured to a different opposed side of said other set of sides, and means relatively fixedly securing opposed individual parts of said first set of elements to one another.

10. The assembly of claim 7, in which said elements of said second set comprise individual parts each secured to a different opposed side of said one set of sides, and means relatively fixedly securing opposed individual parts of said first set of elements to one another, each of said parts comprising electrically conductive sections which are electrically connected to one another and to said sides respectively, thereby to comprise said electrical connections between said other set of sides.

11. The assembly of claim 7, in which said other set of sides have first cam means, said elements of said second set comprising cooperating second cam means, and means for urging said first and second cam means into operative engagement, said cam means being effective to clamp said opposed pair of sides in said elements of said second set respectively.

12. The assembly of claim 7, in which said other set of sides have first cam means, said elements of said second set comprising cooperating second cam means, and means for urging said first and second cam means into operative engagement, said cam means being effective to clamp said opposed pair of sides in said elements of said second set respectively, and to urge said sides against one another.

13. A thermoelectric assembly comprising a plurality of thermoelectric units having hot and cold sides, said units being arranged in a row with the hot and cold sides of adjacent units opposing one another to define sets of opposed similar sides, first and second sets of heat conducting elements substantially rigidly operatively engaging and being in heat conductive relation with one and the other set respectively of said opposed similar sides, means relatively fixedly securing said other set of opposed sides to one another and to said second set of elements, means relatively fixedly securing said one set of elements to said first set of opposed sides respectively while leaving said units free to move relative to one another, and electrical connections between each set of opposed unit sides, the electrical connections between the sides of said one set of opposed sides being flexible, thereby permitting said units to be arranged in a row of desired configuration.

14. The assembly of claim 13, in which said second set of elements are electrically conductive and are electrically connected to the sides which they engage, thereby to comprise said electrical connections between said opposed sides of said other set of unit sides.

15. The assembly of claim 14, in which said elements of said second set comprise individual parts each secured to a different opposed side of said other set of sides, and means relatively fixedly securing opposed individual parts of said first set of elements to one another.

16. The assembly of claim 14, in which said elements of said second set comprise individual parts each secured to a different opposed side of said other set of sides, and means relatively fixedly securing opposed individual parts of said first set of elements to one another, each of said parts comprising electrically conductive sections which are electrically connected to one another and to said sides respectively, thereby to comprise said electrical connections between said other set of sides.

17. The assembly of claim 13, in which said other set of sides have first cam means, said elements of said second set comprising cooperating second cam means, and means for urging said first and second cam means into operative engagement, said cam means being effective to clamp said opposed pair of sides in said elements of said second set respectively.

18. The assembly of claim 13, in which said other set of sides have first cam means, said elements of said second set comprising cooperating second cam means, and means for urging said first and second cam means into operative engagement, said cam means being effective to clamp said opposed pair of sides in said elements of said second set respectively, and to urge said sides against one another.

19. A thermoelectric assembly comprising a plurality of thermoelectric units having hot and cold sides, said units being arranged in groups with similar sides of the units of each group opposing one another, a first set of heat conductive means secured to and extending from said opposed sides of the units of each group and securing the corresponding units to one another to define a substantially rigidly connected group of units, a second set of heat conductive means secured to and extending from the outer sides of the end units of each of said connected group of units, said connected groups of units being arranged in a row with said second heat conductive means and said outer sides of each connected pair of units opposed to the corresponding heat conductive means and outer sides of an adjacent connected group of units, and electrical connections between each pair of opposed unit sides, the electrical connections between said opposed outer sides of said groups being flexible, thereby permitting said connected groups of units to be arranged in a row of desired configuration.

20. A thermoelectric device comprising a support having a wall with spaced openings therethrough, said assembly of claim 19 being received on said support with at least some of said heat conductive means passing through said openings, thereby to retain said assembly in position on said support.

21. A thermoelectric assembly comprising a support, a plurality of thermoelectric units having hot and cold sides mounted in a row thereon with like sides of adjacent units facing one another, a plurality of heat-conductive elements having sockets on opposite sides thereof, said elements being interposed between said units with the facing sides of each pair of adjacent units received in the sockets of a given element, said elements alternately extending in different directions from said support, pressure means active between said support and said row of units to retain them and said elements as a unitary assembly, and electrical connections between each pair of opposed unit sides.

References Cited

UNITED STATES PATENTS

| | | | |
|---|---|---|---|
| 874,780 | 12/1907 | Marsh | 136—208 |
| 2,884,762 | 5/1959 | Lindenblad | 136—208 X |
| 2,959,925 | 11/1960 | Frantti et al. | 136—208 X |
| 3,064,064 | 11/1962 | Jones | 136—203 |

ALLEN B. CURTIS, Primary Examiner

U.S. Cl. X.R.

136—211, 230